(12) United States Patent
Chiang et al.

(10) Patent No.: US 9,973,160 B2
(45) Date of Patent: May 15, 2018

(54) AMPLIFIER DEVICE

(71) Applicant: Realtek Semiconductor Corp., Hsinchu (TW)

(72) Inventors: Ming-Cheng Chiang, Hsinchu (TW); Yan-Yu Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days. days.

(21) Appl. No.: 15/294,871

(22) Filed: Oct. 17, 2016

(65) Prior Publication Data

US 2018/0109232 A1    Apr. 19, 2018

(51) Int. Cl.
*H03F 3/45*    (2006.01)
*H03F 3/183*    (2006.01)

(52) U.S. Cl.
CPC ......... *H03F 3/45479* (2013.01); *H03F 3/183* (2013.01); *H03F 3/45* (2013.01); *H03F 3/45475* (2013.01); *H03F 2200/03* (2013.01); *H03F 2200/165* (2013.01); *H03F 2200/261* (2013.01); *H03F 2200/267* (2013.01); *H03F 2200/48* (2013.01); *H03F 2203/45114* (2013.01); *H03F 2203/45138* (2013.01); *H03F 2203/45151* (2013.01); *H03F 2203/45222* (2013.01)

(58) Field of Classification Search
CPC .. H03F 3/45; H03F 3/45475; H03F 2200/261; H03F 2203/45138; H03F 1/3211; H03F 3/45076; H03F 3/4508; H03F 1/34; H03F 3/45183; H03F 3/45479
USPC .......................................................... 330/69
See application file for complete search history.

(56) References Cited

U.S. PATENT DOCUMENTS

| | | | | |
|---|---|---|---|---|
| 5,568,561 A | * | 10/1996 | Whitlock | ................ H03F 3/347 330/258 |
| 8,476,974 B2 | * | 7/2013 | Froehlich | ................ H03F 3/187 330/260 |
| 8,823,453 B2 | * | 9/2014 | Nys | ........................ H03F 3/3022 330/258 |
| 9,294,048 B2 | * | 3/2016 | Van Helleputte | ......... H03F 3/68 |

* cited by examiner

*Primary Examiner* — Khanh V Nguyen
(74) *Attorney, Agent, or Firm* — McClure, Qualey & Rodack, LLP

(57) ABSTRACT

An amplifier device includes an amplifier circuit, a feedback circuit, and a filter circuit. The amplifier circuit is configured to receive an input signal and a filtered signal, and to output a first output signal and a second output signal at a first output terminal and a second output terminal respectively. The first output signal and the second output signal are a pair of differential signals. The feedback circuit is configured to set direct current (DC) voltage levels of the first output signal and the second output signal to be at a predetermined voltage. The filter circuit is configured to low-pass filter the input signal or to low-pass filter the pair of differential signals so as to generate the filtered signal, and is configured to output the filtered signal to the amplifier circuit.

14 Claims, 8 Drawing Sheets

AMPLIFIER DEVICE

BACKGROUND OF THE INVENTION

1. Field of the Invention

The present disclosure relates to an amplifier device, and more particularly to an amplifier device that reduces needs for external capacitor(s) and that receives a single-ended input signal or a pair of differential input signals.

2. Description of Related Art

A single-ended input of a conventional microphone pre-amplifier is coupled in series with a capacitor that is external to the microphone pre-amplifier, so as to block a direct current (DC) signal and only pass alternating current (AC) signal of an output signal of a conventional microphone. Differential inputs of a conventional microphone pre-amplifier are respectively coupled in series with two capacitors that are external to the microphone pre-amplifier, so as to block direct current (DC) signals and only pass alternating current (AC) signals of a complementary pair of output signals of a conventional microphone. However, such capacitor(s) that are external to the microphone pre-amplifier occupy additional space and require additional component costs.

SUMMARY OF THE INVENTION

In view of the problems of the prior art, an object of the present disclosure is to provide an amplifier device that reduces needs for external capacitor(s) for receiving a single-ended input signal or differential input signals.

The present disclosure describes an amplifier device for receiving a single-ended input signal. The amplifier device includes an amplifier circuit, a feedback circuit, and a filter circuit. The amplifier circuit is configured to receive an input signal and a filtered signal, and to output a first output signal and a second output signal at a first output terminal and a second output terminal, respectively. The first output signal and the second output signal are a pair of differential signals. The feedback circuit is coupled to the amplifier circuit and between the first output terminal and the second output terminal of the amplifier circuit, is configured to set direct current (DC) voltage levels of the first output signal and the second output signal to be at a predetermined voltage. The filter circuit is coupled to the amplifier circuit and configured to low-pass filter the input signal or to low-pass filter the pair of differential signals, so as to generate the filtered signal and to output the filtered signal to the amplifier circuit.

The present disclosure further describes an amplifier device for receiving a pair of differential input signals. The amplifier device includes an amplifier circuit, a feedback circuit, and a filter circuit. The amplifier circuit is configured to receive a first input signal and a filtered signal, and to output a first output signal and a second output signal at a first output terminal and the second output terminal respectively. The first output signal and the second output signal are a pair of differential signals. The feedback circuit is coupled to the amplifier circuit and between the first output terminal and the second output terminal of the amplifier circuit, and configured to set direct current (DC) voltage levels of the first output signal and the second output signal to be at a predetermined voltage. The filter circuit is coupled to the amplifier circuit and configured to receive and high-pass filter a second input signal to output a high-pass filtered signal, and also configured to low-pass filter the first input signal or to low-pass filter the pair of differential signals to output a low-pass filtered signal. The filter circuit is configured to output the filtered signal to the amplifier circuit, in which the filtered signal is a superposition of the high-pass filtered signal and the low-pass filtered signal.

DETAILED DESCRIPTION OF THE EMBODIMENTS

Figure 1:
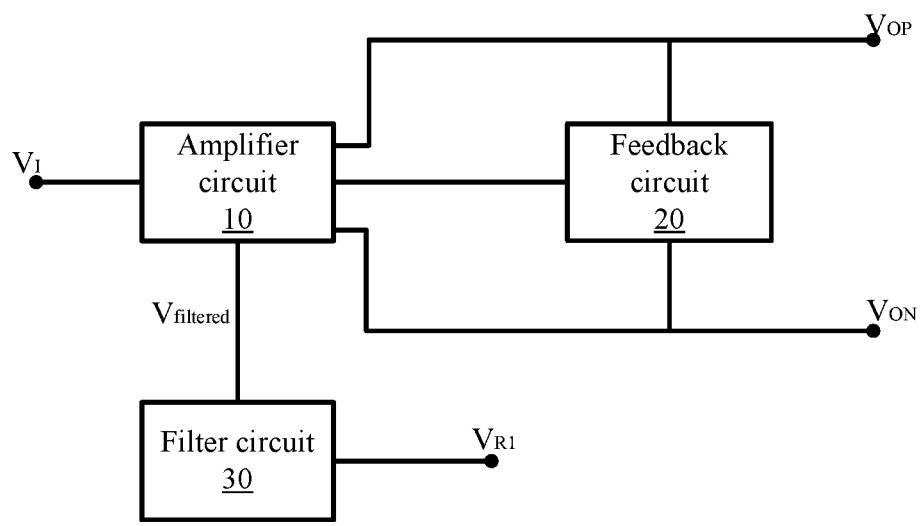
FIG. 1 illustrates an amplifier device according to one embodiment of the present disclosure.

FIG. 1 illustrates an amplifier device 100 according to one embodiment of the present disclosure. The amplifier device 100 includes an amplifier circuit 10, a feedback circuit 20, and a filter circuit 30. The amplifier circuit 10 is coupled to the feedback circuit 20 and the filter circuit 30. The feedback circuit 20 is coupled between a first output terminal and a second output terminal of the amplifier circuit 10.

The amplifier circuit 10 is configured to receive an input signal $V_I$ from an input device (not shown in figures) and a filtered signal $V_{filtered}$ from the filter circuit 30. The amplifier circuit 10 amplifies the input signal $V_I$ so as to output a first output signal $V_{OP}$ and a second output signal $V_{ON}$ at a first output terminal and a second output terminal respectively.

The feedback circuit 20 is configured to set direct current (DC) voltage levels of the first output signal $V_{OP}$ and the second output signal $V_{ON}$ to be at a predetermined voltage.

The filter circuit 30 is configured to low-pass filter a reference signal $V_{R1}$ so as to generate the filtered signal $V_{filtered}$, in which the reference signal $V_{R1}$ may be the input signal $V_I$ or the pair of differential signals, i.e., the first output signal $V_{OP}$ and the second output signal $V_{ON}$. The filter circuit is configured to output the filtered signal $V_{filtered}$ to the amplifier circuit 10. In some embodiments, the filtered signal $V_{filtered}$ can be view as the DC voltage component of the input signal $V_I$.

As a result, the amplifier circuit 10 may receive the input signal $V_I$ from the input device and the filtered signal $V_{filtered}$ from the filter circuit 30, and thus the amplifier device 100 is capable of amplifying the input signal $V_I$ and outputting a pair of differential signals, i.e., the first output signal $V_{OP}$ and the second output signal $V_{ON}$, that have the same DC voltage level, without the need of an external capacitor for high-pass filtering a single-ended input signal.

Figure 2:
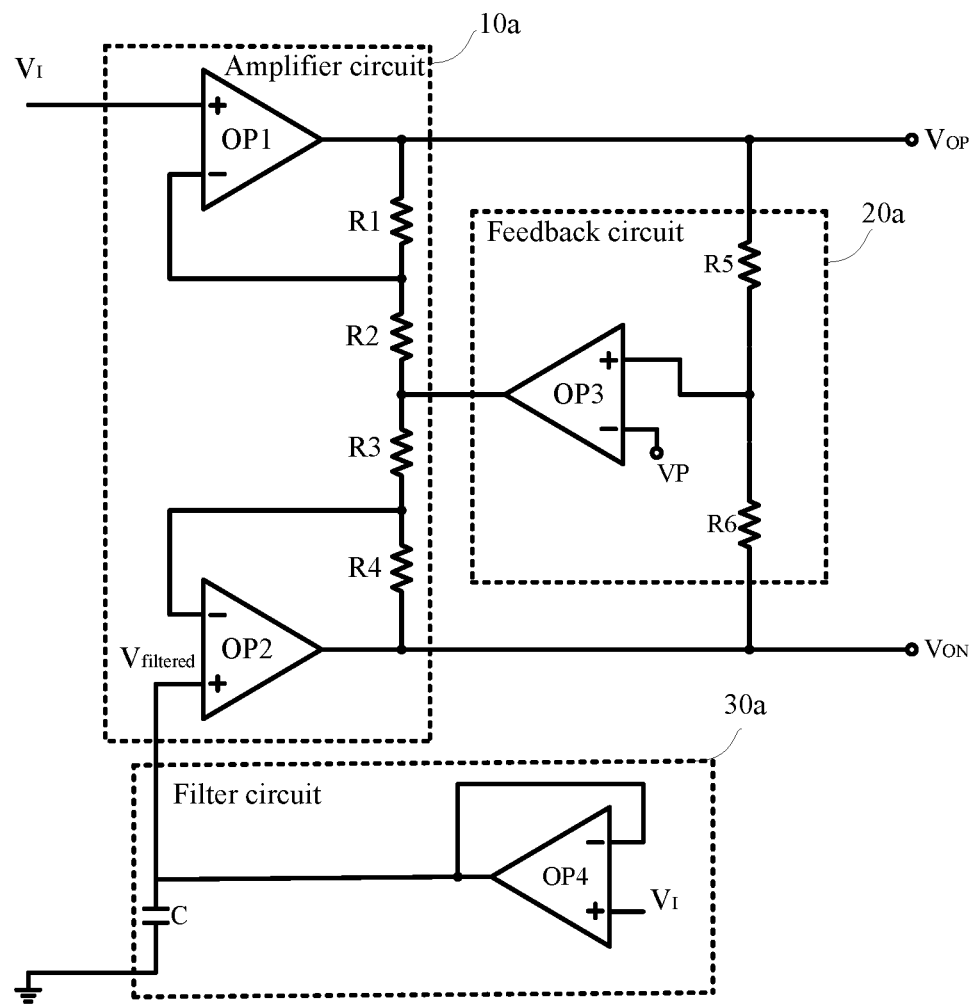
FIG. 2 illustrates an amplifier device according to one embodiment of the present disclosure.

In more detail, reference is also made to FIG. 2. FIG. 2 shows an amplifier device 200 that is an implementation of the amplifier device 100 as shown in FIG. 1. The amplifier circuit 10a includes a first operational amplifier OP1, a second operational amplifier OP2, a first resistor R1, a second resistor R2, a third resistor R3, and a fourth resistor R4. The first operational amplifier OP1 has a first input, a second input and an output, in which the first input is configured to receive the input signal $V_I$ and the output is coupled to the first output terminal of the amplifier circuit 10a. The second operational amplifier OP2 has a first input, a second input and an output, in which the first input is configured to receive the filtered signal $V_{filtered}$ and the output is coupled to the second output terminal. The first resistor R1 is coupled between the second input and the output of the first operational amplifier OP1. The second resistor R2 is coupled between the second input of the first operational amplifier OP1 and the feedback circuit 20a. The third resistor R3 is coupled between the feedback circuit 20a and the second input of the second operational amplifier OP2. The fourth resistor R4 is coupled between the second input and the output of the second operational amplifier OP2. In some implementations, a resistance of the first resistor R1 and a resistance of the fourth resistor R4 are substantially the same, and a resistance of the second resistor R2 and a resistance of the third resistor R3 are substantially the same, such that the amplifier circuit 10a is configured to be symmetrical.

The feedback circuit 20a includes a third operational amplifier OP3, a fifth resistor R5, and a sixth resistor R6. The third operational amplifier OP3 has a first input, a second input and an output, the second input being coupled to the predetermined voltage VP and the output being coupled to the amplifier circuit 10a. The fifth resistor R5 is coupled between the first input of the third operational amplifier OP3 and the first output terminal of the amplifier circuit 10a, and the sixth resistor R6 is coupled between the first input of the third operational amplifier OP3 and the second output terminal of the amplifier circuit 10a. The feedback circuit 20a is configured to set direct current (DC) voltage levels of the first output signal $V_{OP}$ and the second output signal $V_{ON}$ to be at the predetermined voltage VP. In some implementations, a resistance of the fifth resistor R5 and a resistance of the sixth resistor R6 are substantially the same, such that the feedback circuit 20a is configured to be symmetrical. In more details, since the second input of the third operational amplifier OP3 is at the predetermined voltage VP, and the open-loop gain of the third operational amplifier is infinite (in ideal case), the first input of the third operational amplifier OP3 is at the predetermined voltage VP. In addition, the amplifier circuit 10a and the feedback circuit 20a are symmetrical, and accordingly, the DC voltages levels of the first output signal $V_{OP}$ and the second output signal $V_{ON}$ are at the predetermined voltage VP.

In some embodiments, the predetermined voltage VP is a common mode voltage.

The filter circuit 30a includes a fourth operational amplifier OP4 and a capacitor C, in which the capacitor C is an internal capacitor other than an external capacitor. The fourth operational amplifier OP4 includes a first input, a second input and an output. The second input is coupled to the output, the first input receives the input signal $V_I$, and the output is coupled to the amplifier circuit 10a and configured to output the filtered signal $V_{filtered}$. The capacitor C is coupled between the output of the fourth operational amplifier OP4 and a ground terminal. The filter circuit 30a is configured to low-pass filter the input signal $V_I$ so as to generate the filtered signal $V_{filtered}$, which is essentially a direct current (DC) component of the input signal $V_I$.

As a result, the amplifier circuit 10a may receive the input signal $V_I$ from the input device and the filtered signal $V_{filtered}$ from the filter circuit 30a that have the same DC voltage level, and thus the amplifier device 200 is capable of amplifying the AC component of input signal $V_I$ and outputting a pair of differential signals, i.e., the first output signal $V_{OP}$ and the second output signal $V_{ON}$, that have the same DC voltage level, without the need of an external capacitor for high-pass filtering a single-ended input signal $V_I$.

Figure 3A:
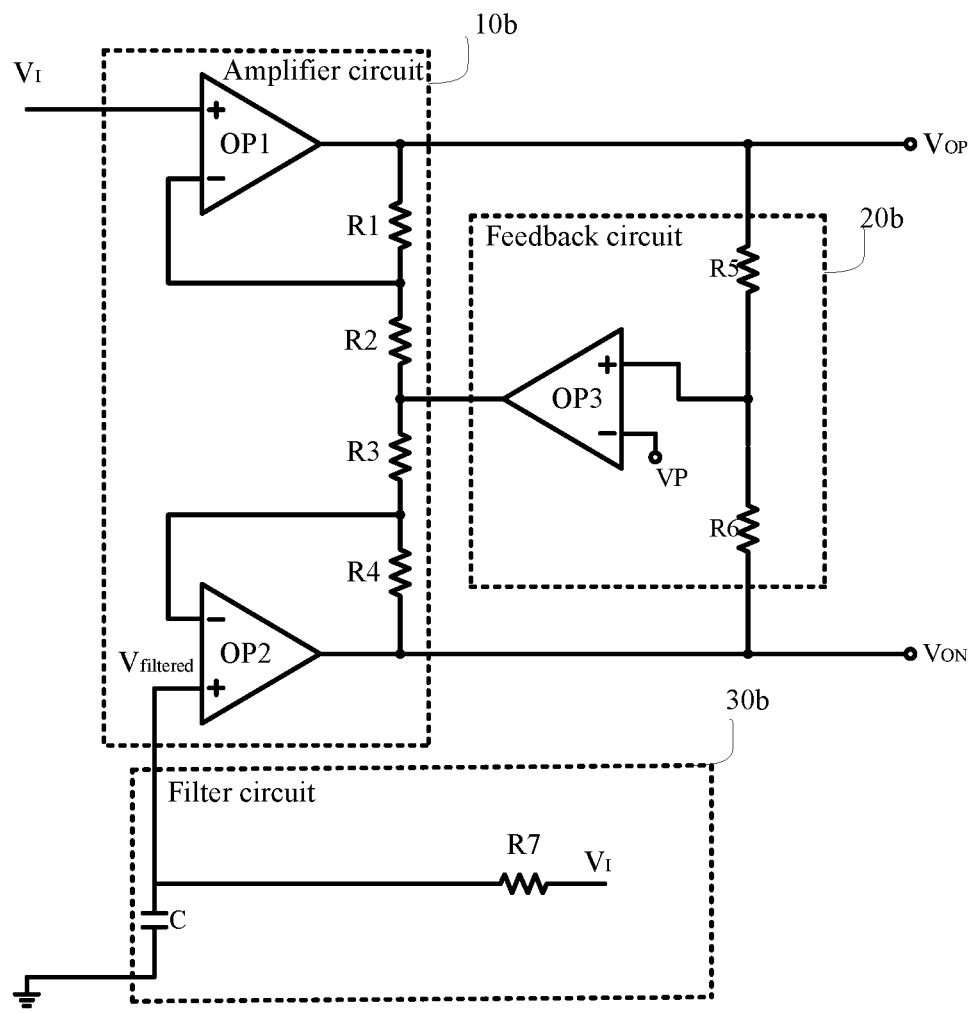
FIG. 3A illustrates an amplifier device according to one embodiment of the present disclosure.

Reference is also made to FIG. 3A. FIG. 3A shows a different implementation, i.e., amplifier device 300, of the amplifier device 100. Compared to the implementation shown in FIG. 2, the amplifier device 300 has a different implementation of the filter circuit 30, i.e., the filter circuit 30b. The filter circuit 30b of an amplifier device 300 is implemented as a resistor-capacitor (RC) filter that receives the input signal $V_I$, and the amplifier circuit 10b and the feedback circuit 20b may be similarly implemented as amplifier circuit 10a and the feedback circuit 20a, respectively, as shown in FIG. 2. The filter circuit 30b includes a resistor R7 and a capacitor C. The resistor R7 has a first terminal coupled to the input signal $V_I$, and a second terminal coupled to the amplifier circuit 10b. The capacitor C has a first terminal coupled to the second terminal of the resistor R7, and a second terminal coupled to a ground terminal. The first input of the second operational amplifier OP2 of the amplifier circuit 10b receives the filtered signal $V_{filtered}$ from the second terminal of the resistor R7.

Figure 3B:
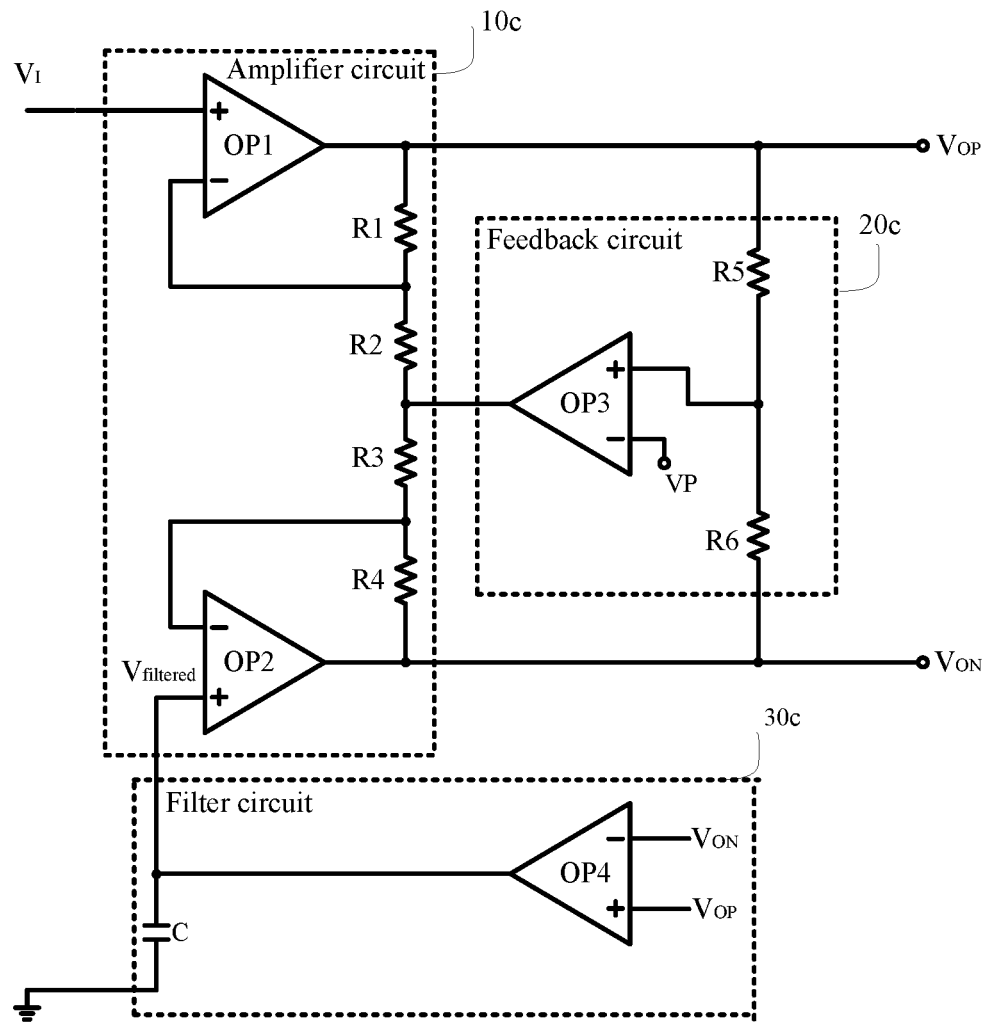
FIG. 3B illustrates an amplifier device according to one embodiment of the present disclosure

Reference is also made to FIG. 3B. FIG. 3B shows a different implementation of the amplifier device 100, i.e., amplifier device 400. Compared to the implementation shown in FIG. 2, the amplifier device 400 has a different implementation of the filter circuit 30, i.e., the filter circuit 30c.

The filter circuit 30c of an amplifier device 400 may be implemented to receive the first output signal $V_{OP}$ and the second output signal $V_{ON}$, and the amplifier circuit 10c and the feedback circuit 20c may be similarly implemented as amplifier circuit 10a and the feedback circuit 20a, respectively, as shown in FIG. 2. Accordingly, the fourth operational amplifier OP4 of the filter circuit 30c may be configured in an arrangement that the first input receives the first output signal $V_{OP}$, the second input receives the second output signal $V_{ON}$, and the output is coupled to the amplifier circuit 10c and configured to output the filtered signal $V_{filtered}$, which has a direct current (DC) voltage level that approaches the voltage level of the DC component of the input signal $V_I$.

Figure 4:
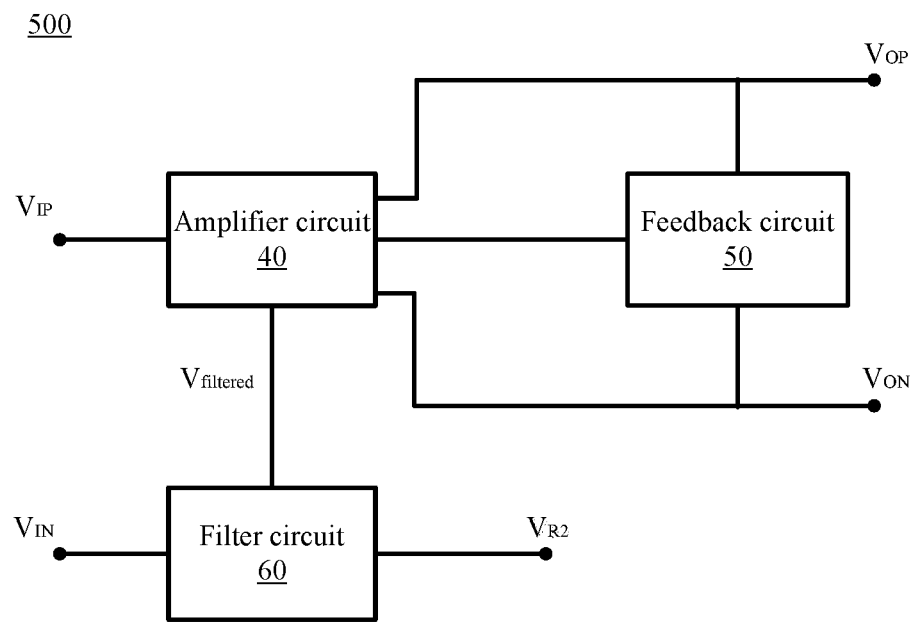
FIG. 4 illustrates an amplifier device according to one embodiment of the present disclosure.

FIG. 4 illustrates an amplifier device 500 according to one embodiment of the present disclosure. This embodiment differs from the embodiment illustrated in FIG. 1 in that the amplifier device 500 receives a pair of differential input signals from an input device (not shown) such as a microphone. The amplifier device 500 of this embodiment includes an amplifier circuit 40, a feedback circuit 50, and a filter circuit 60. The amplifier circuit 40 is coupled to the feedback circuit 50 and the filter circuit 60. The feedback circuit 50 is coupled between a first output terminal and a second output terminal of the amplifier circuit 40.

The amplifier circuit 40 is configured to receive a first input signal $V_{IP}$ from an input device (not shown in figures) and a filtered signal $V_{filtered}$ from the filter circuit 60, and accordingly output a first output signal $V_{OP}$ and a second output signal $V_{ON}$ at a first output terminal and the second output terminal respectively, in which the first output signal $V_{OP}$ and the second output signal $V_{ON}$ are the pair of differential signals.

The feedback circuit 50 is configured to set direct current (DC) voltage levels of the first output signal $V_{OP}$ and the second output signal $V_{ON}$ to be at a predetermined voltage.

The filter circuit 60 is configured to receive and high-pass filter a second input signal $V_{IN}$ to output a high-pass filtered signal $V_{HP}$, and is also configured to low-pass filter a reference signal $V_{R2}$, in which the reference signal $V_{R2}$ may be the first input signal $V_{IP}$ or the pair of differential signals (i.e., the first output signal $V_{OP}$ and the second output signal $V_{ON}$), to output a low-pass filtered signal $V_{LP}$. The filter circuit 60 is configured to perform a superposition of the high-pass filtered signal $V_{HP}$ and the low-pass filtered signal $V_{LP}$ that is outputted as the filtered signal $V_{filtered}$ to the amplifier circuit 40.

As a result, the amplifier device 500 may receive the input signal $V_{IP}$ from the input device and the filtered signal $V_{filtered}$ from the filter circuit 60 that is the superposition of the high-pass filtered signal $V_{HP}$ and the low-pass filtered signal $V_{LP}$, and thus the amplifier device 500 is capable of amplifying the first input signal $V_{IP}$ and the second input signal $V_{IN}$ and outputting a pair of differential signals (the first output signal $V_{OP}$ and the second output signal $V_{ON}$) that have the same DC voltage level, without the need for external capacitors for high-pass filtering a pair of differential input signals.

Figure 5:
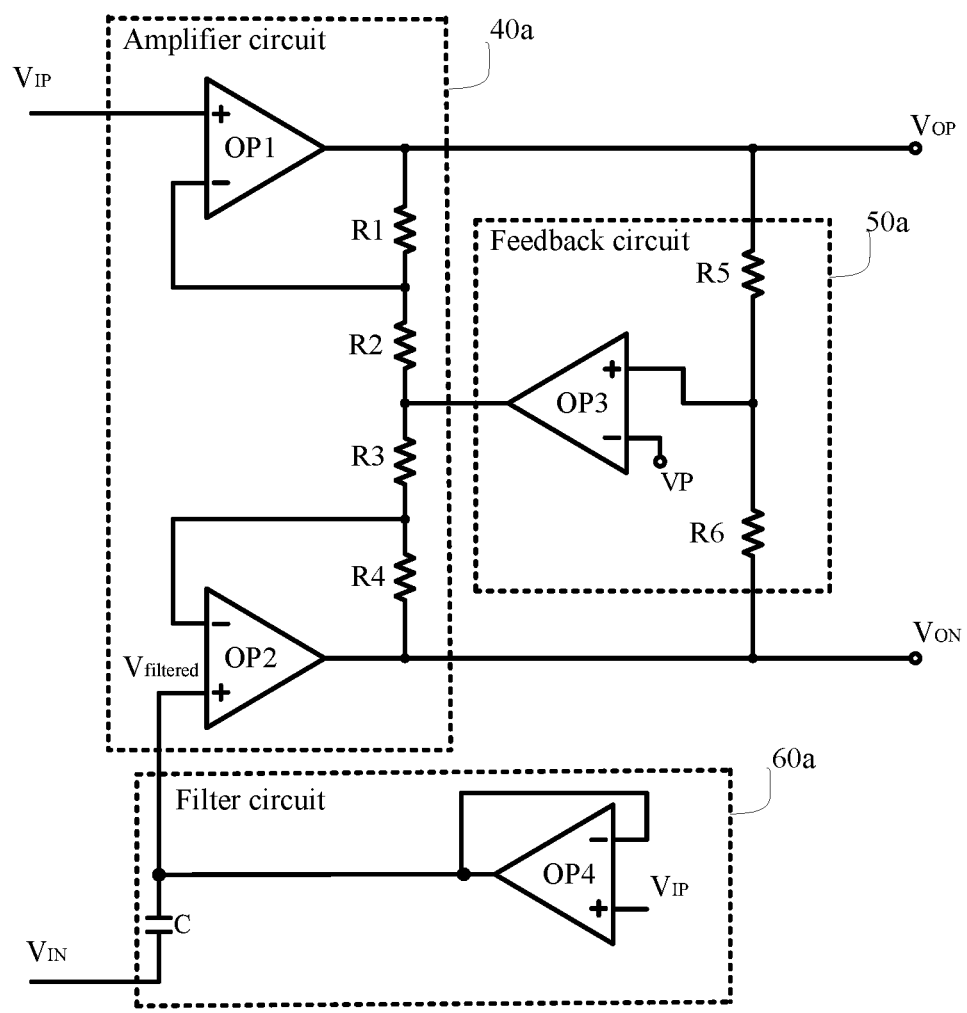
FIG. 5 illustrates an amplifier device according to one embodiment of the present disclosure.

FIG. 5 shows an amplifier device 600 that is an implementation of the amplifier device 500 as shown in FIG. 4. The amplifier circuit 40a and the feedback circuit 50a may be similarly implemented as the amplifier circuit 10a and the feedback circuit 20a of the amplifier device 200, respectively.

The filter circuit 60a of the amplifier device 600 includes a fourth operational amplifier OP4 and a capacitor C. The fourth operational amplifier OP4 has a first input, a second input and an output. The second input is coupled to the output, the first input receives the first input signal $V_{IP}$, and the output is coupled to the amplifier circuit 40a and configured to output the filtered signal $V_{filtered}$. The capacitor C has a first terminal coupled to the output of the fourth operational amplifier OP4 and a second terminal configured to receive the second input signal $V_{IN}$. The capacitor C high-pass filters the second input signal $V_{IN}$ to output the high-pass filtered signal $V_{HP}$, low-pass filters the first input signal $V_1$ to output the low-pass filtered signal $V_{LP}$, and accordingly outputs the filtered signal $V_{filtered}$ that is the superposition of the high-pass filtered signal $V_{HP}$ and the low-pass filtered signal $V_{LP}$. As a result, the amplifier device 600 may receive the input signal $V_{IP}$ from the input device and the filtered signal $V_{filtered}$ from the filter circuit 60a that is the superposition of the high-pass filtered signal $V_{HP}$ and the low-pass filtered signal $V_{LP}$, and thus the amplifier device 600 is capable of amplifying the first input signal $V_{IP}$ and the second input signal $V_{IN}$ and outputting a pair of differential signals (the first output signal $V_{OP}$ and the second output signal $V_{ON}$) that have the same DC voltage level, without the need for external capacitors for high-pass filtering a pair of differential input signals.

Figure 6A:
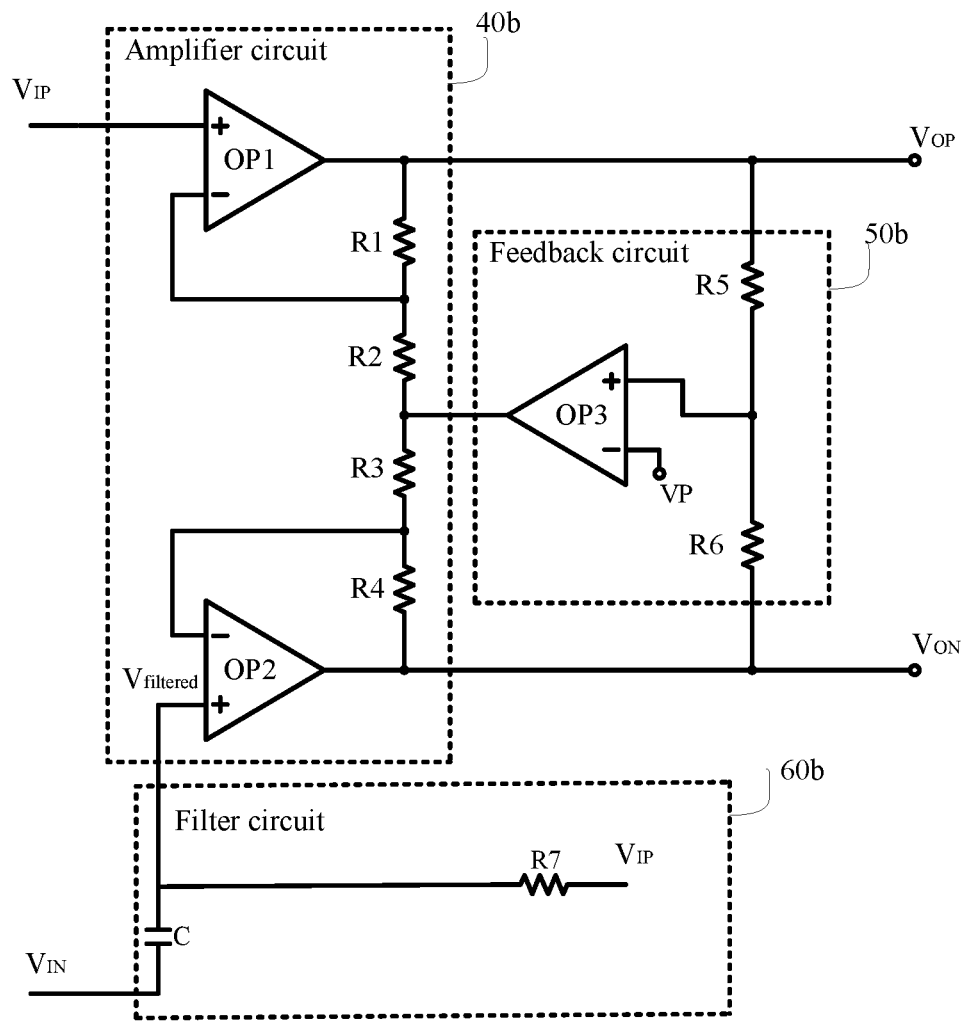
FIG. 6A illustrates an amplifier device according to one embodiment of the present disclosure.

Reference is also made to FIG. 6A. FIG. 6A shows a different implementation, i.e., amplifier device 700, of the amplifier device 500. Compared to the implementation shown in FIG. 5, the amplifier device 700 has a different implementation of the filter circuit 60, i.e., the filter circuit 60b.

The filter circuit 60b of an amplifier device 700 may also be implemented as a RC filter that receives the input signal $V_{IP}$, and the amplifier circuit 40b and the feedback circuit 50b may be similarly implemented as amplifier circuit 40a and the feedback circuit 50a, respectively, as shown in FIG. 5. The filter circuit 60b includes a resistor R7 and a capacitor C. The resistor R7 has a first terminal coupled to the first input signal $V_{IP}$, and a second terminal coupled to the amplifier circuit 40b. The capacitor C has a first terminal coupled to the second terminal of the resistor R7, and a second terminal configured to receive the second input signal $V_{IN}$. The first input of the second operational amplifier OP2 receives the filtered signal $V_{filtered}$ from the second terminal of the resistor R7.

Figure 6B:
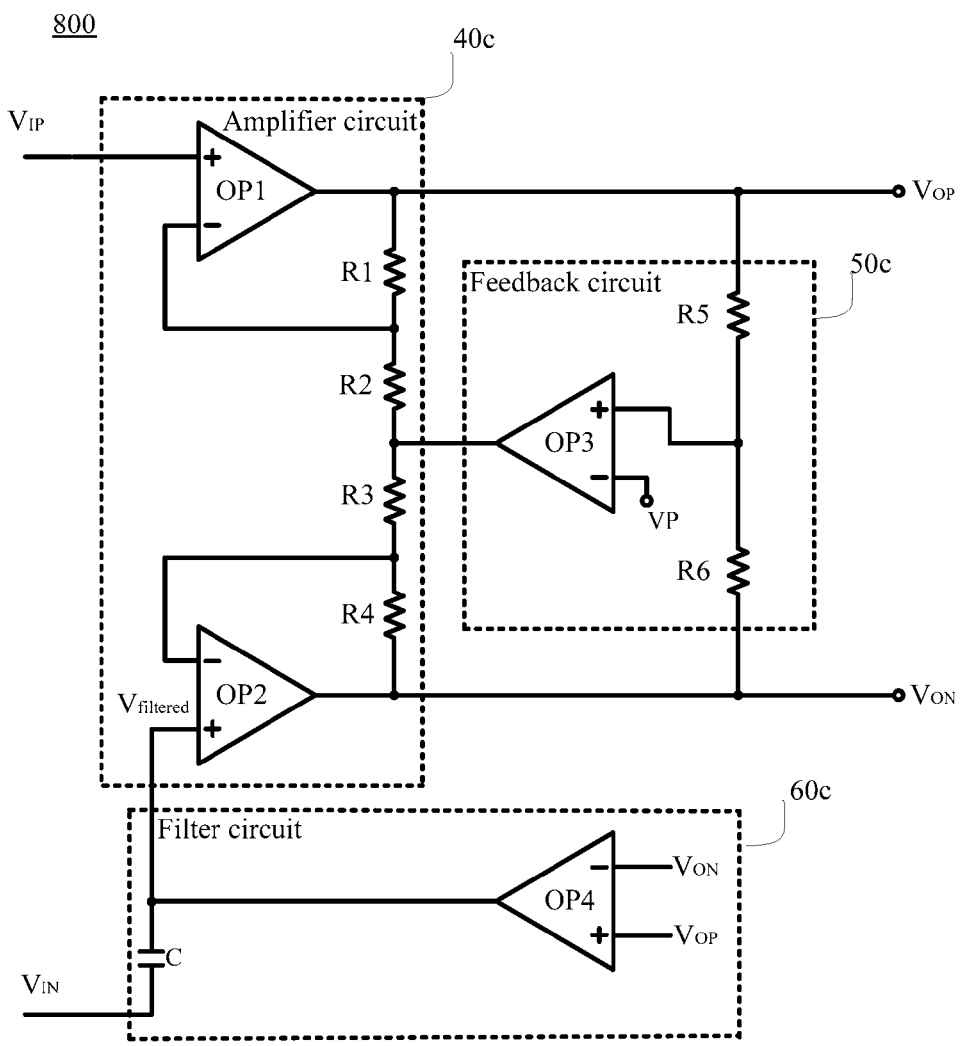
FIG. 6B illustrates an amplifier device according to one embodiment of the present disclosure.

Reference is also made to FIG. 6B. FIG. 6B shows a different implementation of the amplifier device 500, i.e., amplifier device 800. Compared to the implementation shown in FIG. 5, the amplifier device 800 has a different implementation of the filter circuit 60, i.e., the filter circuit 60c.

The filter circuit 60c of an amplifier device 800 may be implemented to receive the first output signal $V_{OP}$ and the second output signal $V_{ON}$, and the amplifier circuit 40c and the feedback circuit 50c may be similarly implemented as amplifier circuit 40a and the feedback circuit 50a, respectively, as shown in FIG. 5. Accordingly, the fourth operational amplifier OP4 of the filter circuit 60c may be configured in an arrangement that the first input receives the first output signal $V_{OP}$, the second input receives the second output signal $V_{ON}$, and the output is coupled to the amplifier circuit 40c and configured to output the filtered signal $V_{filtered}$, which has a direct current (DC) voltage level that approaches the voltage level of the DC component of the input signal $V_I$.

Embodiments of the present invention have been described above with the aid of functional building blocks illustrating the performance of specified functions and relationships thereof. The boundaries and sequence of these functional building blocks have been somewhat arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Such alternate definitions of functional building blocks are thus within the scope and spirit of the claimed invention. Persons of ordinary skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the present invention.

What is claimed is:

1. An amplifier device, comprising:
   an amplifier circuit configured to receive an input signal and a filtered signal, and to output a first output signal and a second output signal at a first output terminal and a second output terminal respectively, wherein the first output signal and the second output signal are a pair of differential signals;
   a feedback circuit coupled to the amplifier circuit and between the first output terminal and the second output terminal of the amplifier circuit, configured to set direct current (DC) voltage levels of the first output signal and the second output signal to be at a predetermined voltage, wherein the feedback circuit comprises:
      a third operational amplifier having a first input, a second input and an output, wherein the second input is coupled to the predetermined voltage, and the output is coupled to the amplifier circuit;
      a fifth resistor coupled between the first input of the third operational amplifier and the first output terminal; and
      a sixth resistor coupled between the first input of the third operational amplifier and the second output terminal; and
   a filter circuit coupled to the amplifier circuit, configured to low-pass filter the input signal or to low-pass filter the pair of differential signals so as to generate the filtered signal, and configured to output the filtered signal to the amplifier circuit.

2. The amplifier device of claim 1, wherein the amplifier circuit comprises:
   a first operational amplifier having a first input, a second input and an output, wherein the first input is configured to receive the input signal, and the output is coupled to the first output terminal;
   a second operational amplifier having a first input, a second input and an output, wherein the first input is configured to receive the filtered signal, and the output is coupled to the second output terminal;
   a first resistor coupled between the second input and the output of the first operational amplifier;
   a second resistor coupled between the second input of the first operational amplifier and the feedback circuit;
   a third resistor coupled between the feedback circuit and the second input of the second operational amplifier; and
   a fourth resistor coupled between the second input and the output of the second operational amplifier.

3. The amplifier device of claim 2, wherein a resistance of the first resistor and a resistance of the fourth resistor are substantially the same, and a resistance of the second resistor and a resistance of the third resistor are the same.

4. The amplifier device of claim 1, wherein the predetermined voltage is a common mode voltage (VCM).

5. The amplifier device of claim 1, wherein the filter circuit comprises:
   a fourth operational amplifier comprising a first input, a second input and an output, wherein the first input receives a first output voltage signal, the second input receives a second output voltage signal, and the output is coupled to the amplifier circuit and configured to output the filtered signal; and
   a capacitor coupled between the output of the fourth operational amplifier and a ground terminal.

6. The amplifier device of claim 2, wherein the filter circuit comprises:
   a resistor having a first terminal coupled to the input signal, and a second terminal coupled to the amplifier circuit; and
   a capacitor having a first terminal coupled to the second terminal of the resistor, and a second terminal coupled to a ground terminal;
   wherein the first input of the second operational amplifier receives the filtered signal from the second terminal of the resistor.

7. An amplifier device, comprising:
   an amplifier circuit configured to receive an input signal and a filtered signal, and to output a first output signal and a second output signal at a first output terminal and a second output terminal respectively, wherein the first output signal and the second output signal are a pair of differential signals;
   a feedback circuit coupled to the amplifier circuit and between the first output terminal and the second output terminal of the amplifier circuit, configured to set direct current (DC) voltage levels of the first output signal and the second output signal to be at a predetermined voltage; and
   a filter circuit coupled to the amplifier circuit, configured to low-pass filter the input signal or to low-pass filter the pair of differential signals so as to generate the filtered signal, and configured to output the filtered signal to the amplifier circuit, wherein the filter circuit comprises:
      a fourth operational amplifier comprising a first input, a second input and an output, wherein the second input is coupled to the output, the first input receives the input signal, and the output is coupled to the amplifier circuit and configured to output the filtered signal; and
      a capacitor coupled between the output of the fourth operational amplifier and a ground terminal.

8. An amplifier device, comprising:
   an amplifier circuit configured to receive a first input signal and a filtered signal, and to output a first output signal and a second output signal at a first output terminal and a second output terminal respectively, wherein the first output signal and the second output signal are a pair of differential signals;
   a feedback circuit coupled to the amplifier circuit and between the first output terminal and the second output terminal of the amplifier circuit, configured to set direct current (DC) voltage levels of the first output signal and the second output signal to be at a predetermined voltage, wherein the feedback circuit comprises:
      a third operational amplifier having a first input, a second input and an output, wherein the second input is coupled to the predetermined voltage, and the output is coupled to the amplifier circuit;
      a fifth resistor coupled between the first input of the third operational amplifier and the first output terminal; and
      a sixth resistor coupled between the first input of the third operational amplifier and the second output terminal; and
   a filter circuit coupled to the amplifier circuit, configured to receive and high-pass filter a second input signal to output a high-pass filtered signal, configured to low-pass filter the first input signal or to low-pass filter the pair of differential signals to output a low-pass filtered signal, and configured to output the filtered signal to the amplifier circuit, wherein the filtered signal is a superposition of the high-pass filtered signal and the low-pass filtered signal.

9. The amplifier device of claim 8, wherein the amplifier circuit comprises:
   a first operational amplifier having a first input, a second input and an output, wherein the first input is configured to receive the first input signal, and the output is coupled to the first output terminal;
   a second operational amplifier having a first input, a second input and an output, wherein the first input is configured to receive the filtered signal, and the output is coupled to the second output terminal;
   a first resistor coupled between the second input and the output of the first operational amplifier;
   a second resistor coupled between the second input of the first operational amplifier and the feedback circuit;
   a third resistor coupled between the feedback circuit and the second input of the second operational amplifier; and
   a fourth resistor coupled between the second input and the output of the second operational amplifier.

10. The amplifier device of claim 9, wherein a resistance of the first resistor and a resistance of the fourth resistor are the same, and a resistance of the second resistor and a resistance of the third resistor are the same.

11. The amplifier device of claim 8, wherein the predetermined voltage is a common mode voltage (VCM).

12. The amplifier device of claim 8, wherein the filter circuit comprises:
    a fourth operational amplifier comprising a first input, a second input and an output, wherein the first input receives a first output voltage signal, the second input receives a second output voltage signal, and the output is coupled to the amplifier circuit and configured to output the filtered signal; and
    a capacitor having a first terminal coupled to the output of the fourth operational amplifier and a second terminal configured to receive the second input signal.

13. The amplifier device of claim 8, wherein the filter circuit comprises:
    a fourth operational amplifier comprising a first input, a second input and an output, wherein the second input is coupled to the output, the first input receives the first input signal, and the output is coupled to the amplifier circuit and configured to output the filtered signal; and
    a capacitor having a first terminal coupled to the output of the fourth operational amplifier and a second terminal configured to receive the second input signal.

14. The amplifier device of claim 9, wherein the filter circuit comprises:
    a resistor having a first terminal coupled to the first input signal, and a second terminal coupled to the amplifier circuit; and
    a capacitor having a first terminal coupled to the second terminal of the resistor, and a second terminal configured to receive the second input signal;
    wherein the first input of the second operational amplifier receives the filtered signal from the second terminal of the resistor.

* * * * *